(12) United States Patent
Bellin et al.

(10) Patent No.: US 8,094,451 B2
(45) Date of Patent: Jan. 10, 2012

(54) ONBOARD COMPUTER EQUIPPED WITH A STAND-ALONE AERAULIC COOLING DEVICE

(75) Inventors: Bruno Bellin, Le-Buisson (FR); Gerard Nemoz, Maisons Alfort (FR); Serge Bernadac, Bagneux (FR); Jean-Michel Civadier, Clamart (FR)

(73) Assignee: Thales, Neuilly sur Seine (FR)

( * ) Notice: Subject to any disclaimer, the term of this patent is extended or adjusted under 35 U.S.C. 154(b) by 337 days.

(21) Appl. No.: 12/535,608

(22) Filed: Aug. 4, 2009

(65) Prior Publication Data

US 2010/0302727 A1 Dec. 2, 2010

(30) Foreign Application Priority Data

Aug. 5, 2008 (FR) ..................................... 08 04477

(51) Int. Cl.
*H05K 7/20* (2006.01)
*H05K 5/00* (2006.01)
(52) U.S. Cl. ......................... 361/695; 361/694; 454/184
(58) Field of Classification Search ............ 361/679.49, 361/694, 695; 454/184
See application file for complete search history.

(56) References Cited

U.S. PATENT DOCUMENTS

| | | | | |
|---|---|---|---|---|
| 3,648,113 | A * | 3/1972 | Rathjen et al. ................. | 361/707 |
| 5,027,254 | A * | 6/1991 | Corfits et al. ................. | 361/694 |
| 5,207,613 | A | 5/1993 | Ferchau et al. | |
| 5,321,581 | A | 6/1994 | Bartilson et al. | |
| 5,396,401 | A | 3/1995 | Nemoz | |
| 5,400,217 | A | 3/1995 | Whitson et al. | |
| 5,559,673 | A * | 9/1996 | Gagnon et al. ................. | 361/695 |
| 6,280,318 | B1 * | 8/2001 | Criss-Puszkiewicz et al. .............................. | 454/184 |
| 6,661,657 | B1 * | 12/2003 | Banton et al. ................. | 361/690 |
| 6,765,795 | B2 * | 7/2004 | Modica ......................... | 361/695 |
| 6,997,720 | B2 | 2/2006 | Perret et al. | |
| 7,027,301 | B2 * | 4/2006 | Merlet .......................... | 361/695 |
| 7,259,961 | B2 * | 8/2007 | Lucero et al. .................. | 361/695 |
| 7,304,855 | B1 | 12/2007 | Milligan et al. | |
| 7,636,239 | B2 * | 12/2009 | Katakura et al. ............. | 361/695 |
| 2002/0159232 | A1 * | 10/2002 | Beitelmal et al. ............ | 361/695 |
| 2004/0017654 | A1 * | 1/2004 | Modica ......................... | 361/687 |
| 2004/0095723 | A1 * | 5/2004 | Tsai et al. ...................... | 361/695 |
| 2009/0161721 | A1 | 6/2009 | Gatti et al. | |
| 2009/0195135 | A1 | 8/2009 | Nemoz et al. | |

FOREIGN PATENT DOCUMENTS

| | | |
|---|---|---|
| EP | 0 735 810 A | 10/1996 |
| FR | 2 905 556 A | 3/2008 |

OTHER PUBLICATIONS

Gerard Nemoz, et al. U.S. Appl. No. 11/915,372, Modular Electronic Device Operating in Difficult Environments, Apr. 24, 2006.

(Continued)

*Primary Examiner* — Gregory Thompson
(74) *Attorney, Agent, or Firm* — LaRiviere, Grubman & Payne, LLP

(57) ABSTRACT

The present invention proposes an onboard computer equipped with a stand-alone aeraulic cooling device. Its main benefit is that it improves the effectiveness of the aeraulic cooling of onboard computers, thanks to the provision of ducts (N1, N2, N3) routing a cool air stream (FA) to the hot spots of the electronic modules (E1, E2, E3, E4).

7 Claims, 3 Drawing Sheets

OTHER PUBLICATIONS

Figure 1:
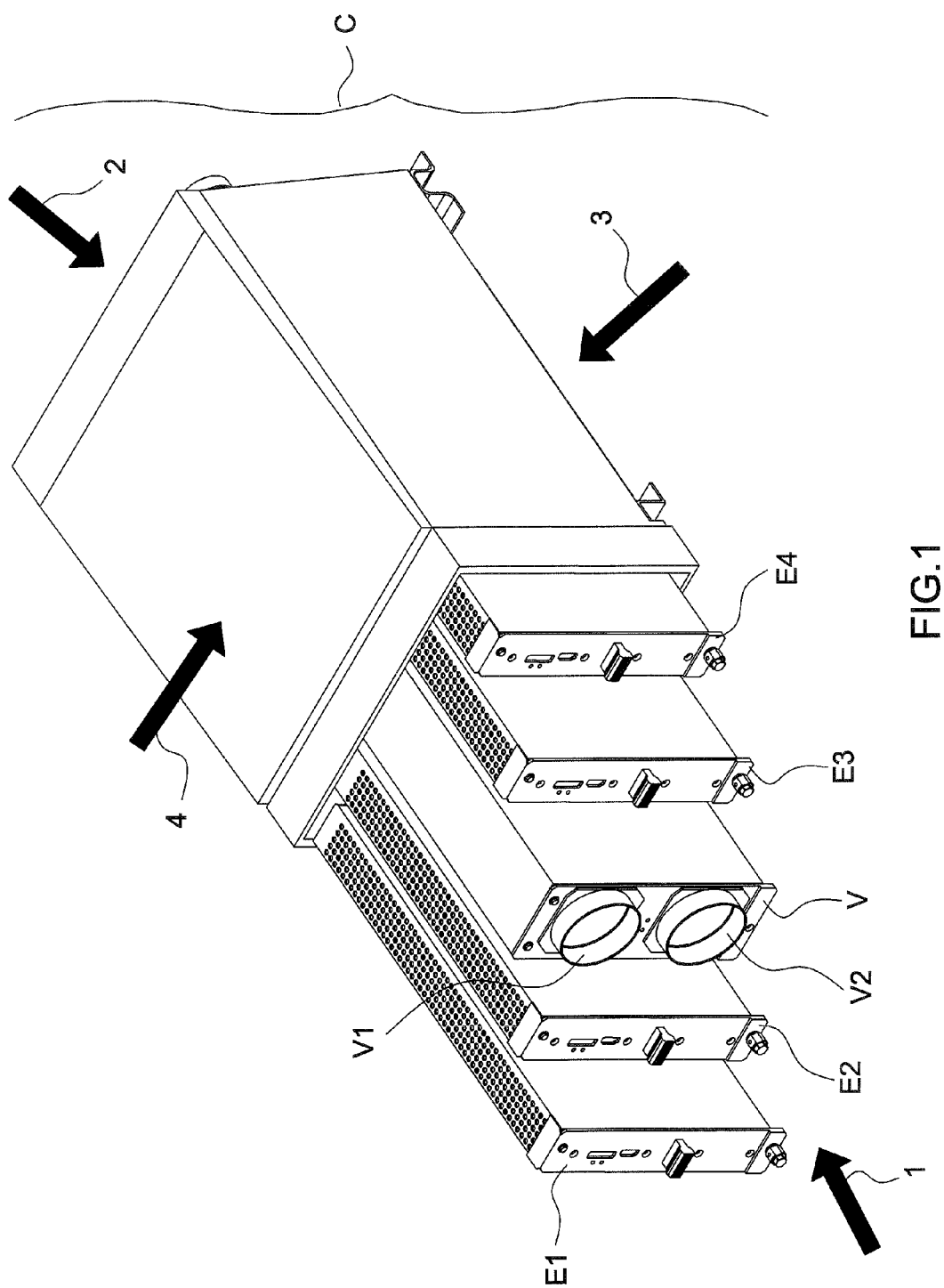

Gerard Nemoz, et al. U.S. Appl. No. 11/722,319, Electronic Device Module, Nov. 14, 2005.

Gerard Nemoz, et al. U.S. Appl. No. 12/438,417, Electronic Rack Combining Natural Convection and Forced Air Circulation for Its Cooling, Aug. 27, 2007.

Gerard Nemoz, et al. U.S. Appl. No. 12/519,639, Electronic Equipment Housing Cooled by Natural and Forced Ventilation, Nov. 12, 2007.

Gerard Nemoz, et al. U.S. Appl. No. 12/415,074, Computer With Simplified Layout, Designed for Aviation, Mar. 31, 2009.

* cited by examiner

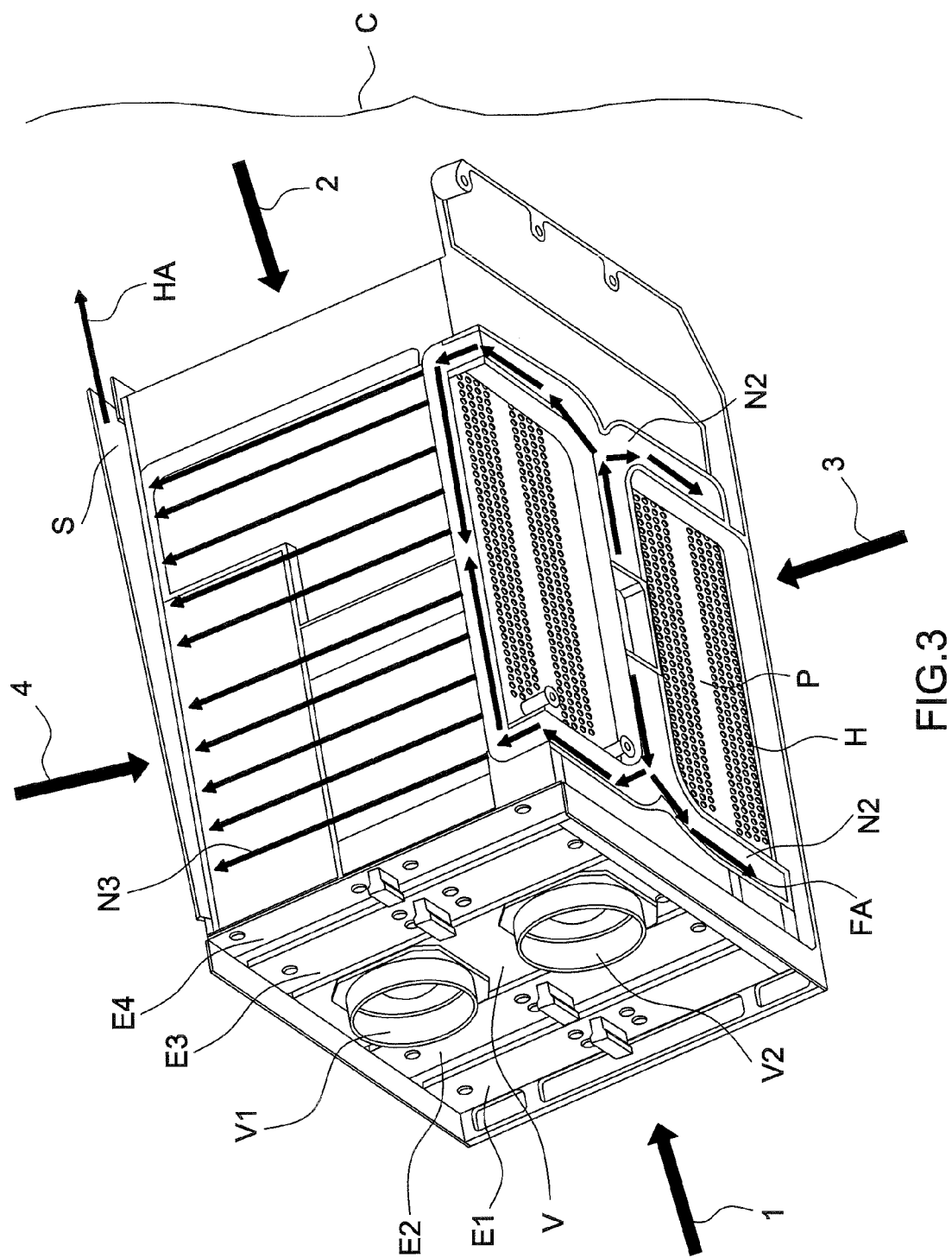

ONBOARD COMPUTER EQUIPPED WITH A STAND-ALONE AERAULIC COOLING DEVICE

PRIORITY CLAIM

This application claims priority to French Patent Application Number 08 04477, Onboard Computer Equipped with a Stand-Alone Aeraulic Cooling Device, filed on Aug. 5, 2008.

FIELD OF THE INVENTION

The present invention relates to the field of aeraulically-cooled computers. More specifically, the invention proposes an onboard computer, an avionics computer in particular, equipped with a stand-alone aeraulic cooling device.

BACKGROUND OF THE INVENTION

Currently, avionics computers cooled by aeraulic means simply use fans located on the front face or at the level of the bottom face of said computers.

Until recently, there was no real need to seek to optimize this type of aeraulic cooling. In practice, the power dissipated inside the computers was relatively low, and hot spots did not appear on the electronic modules requiring any particular attention. Simple ventilation by a stream of air injected into the computers was sufficient to ensure that they operated correctly.

These days, the power density dissipated at the core of avionics computers is greatly increasing. The electronic components used, increasingly small and increasingly powerful in terms of computation capabilities, also dissipate more and more power in restricted spaces.

Initially, increasing the size or the number of fans present in the computers was envisaged in order to better cool them. However, this simplistic solution is unsatisfactory: it raises problems of bulk and acoustic noise.

SUMMARY OF THE INVENTION

The present patent application therefore falls into a context of researching a way of optimizing the aeraulic cooling of onboard avionics computers.

The invention makes it possible to cool, effectively and in a stand-alone manner, onboard computers by focusing on the hottest areas of the electronic modules contained in said computers.

To this end, the subject of the invention is an onboard computer comprising electronic modules and an aeraulic cooling module, and having a front face, a rear face, a bottom face and a top face, characterized in that said aeraulic cooling module comprises:
- at least one fan situated on the front face, and used to inject a stream of cool air into said computer,
- a network of ducts comprising first ducts for routing the stream of cool air to the level of the bottom face, and second ducts for distributing said stream of cool air to the level of said bottom face, approximately vertical to said electronic modules, said stream of cool air rising along said electronic modules in order to cool them, and becoming, at the level of the top face, a stream of hotter air.

Advantageously, the inventive computer can comprise two fans on the front face.

Advantageously, the fan or fans are positioned inside the aeraulic cooling module, allowing for a strong attenuation, through the walls of said aeraulic cooling module, of the noise generated by said fans.

With hot spots, corresponding to areas having a particularly high dissipated power density, being identified on the electronic modules, a complementary network of ducts advantageously routes the stream of cool air along the electronic modules passing as a priority through said hot spots.

Advantageously, said hot spots are linked to heat sinks mounted on the electronic modules via a network of piccolo tubes.

Advantageously, the inventive computer also comprises, at the level of the bottom face, a largely open bottom plate, comprising holes that can be of a diameter greater than approximately 5 millimetres, so as to favour natural convection within said computer.

Advantageously, the inventive computer also comprises a vent at the level of the top face, routing the stream of hotter air to the rear face of the computer, where said stream of hotter air is discharged, thereby preventing any circulation of the stream of hotter air towards the front face of the computer.

BRIEF LIST OF THE DRAWINGS

Figure 2:
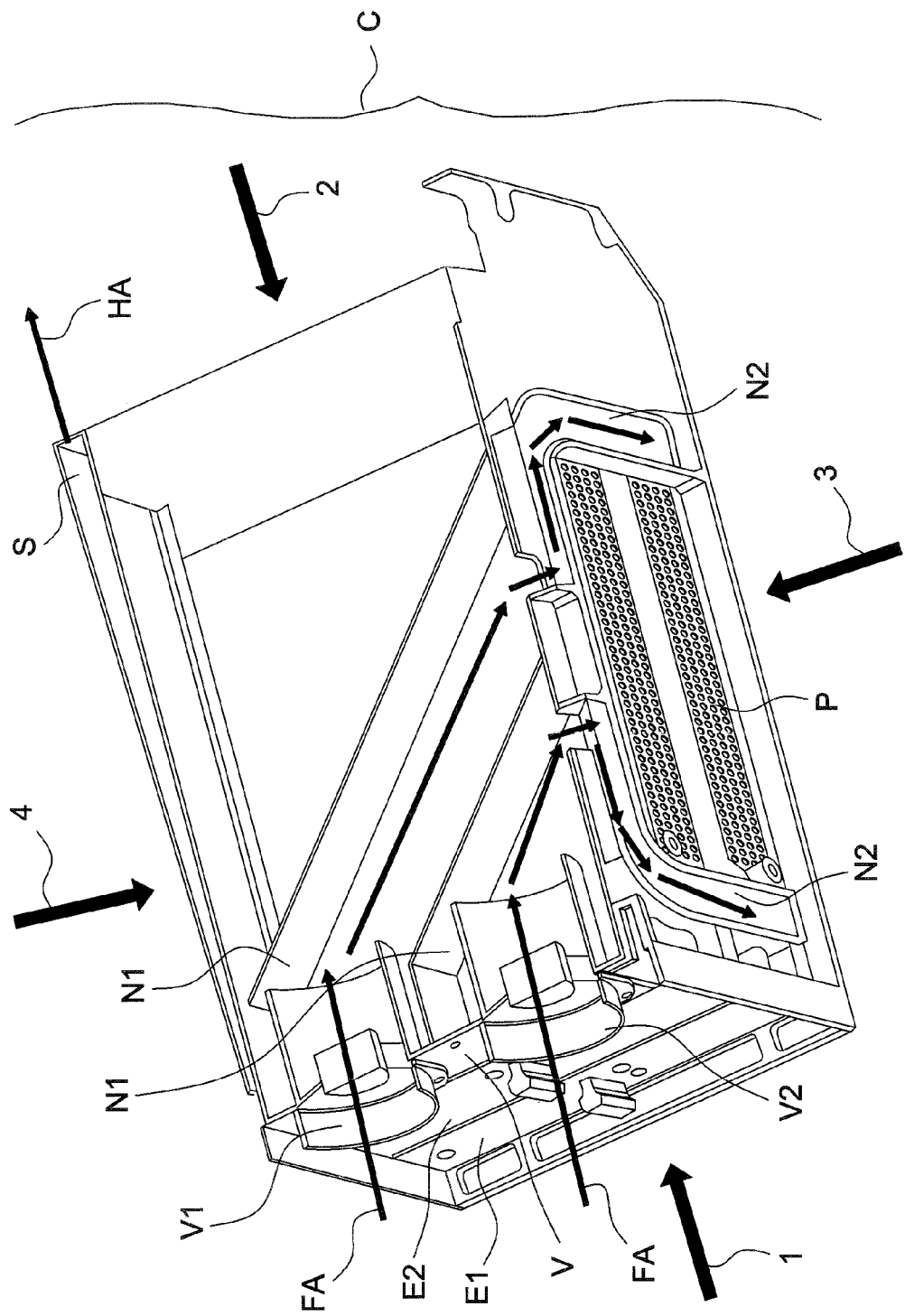

Other features and benefits of the invention will become apparent from the following description given in light of the appended drawings which represent:

FIG. 1: the overview of an avionics computer according to the invention, comprising four electronic modules and an aeraulic cooling module;

FIG. 2: the cross-sectional view of an avionics computer according to the invention;

FIG. 3: the three-dimensional view of an avionics computer according to the invention, highlighting the circulation of the stream of cool air inside said computer.

DETAILED DESCRIPTION OF THE INVENTION

FIG. 1 shows a diagram of a computer C according to the invention. The latter has four electronic modules E1, E2, E3, E4 and an aeraulic cooling module V. All the modules are plugged into or extracted from the front face 1, orthogonally to the rear face 2. They are also orthogonal to the bottom 3 and top 4 faces. The aeraulic cooling module V comprises at least one fan; in the example of FIG. 1, it has two fans V1 and V2. These extract cool air through the front face 1 and inject it into the computer C.

Moreover, just like the electronic modules, the aeraulic cooling module is easy to access and remove, and therefore easy to replace.

FIG. 2 illustrates the first principle of operation of the invention. A stream of cool air FA, introduced at the front face by the fans V1 and V2, is injected into the computer C. Initially, this stream of cool air FA is then routed to the bottom face 3 by first ducts N1. Second ducts N2 then distribute the stream of cool air FA at the level of the bottom face 3. The cool air is thus injected at the foot of the electronic modules E1, E2, E3, E4 along which the stream of cool air FA rises towards the top face 4, where it will be discharged to the rear face 2 via the vent S, according to the principle described in FIG. 3.

Thus, the stream of cool air FA preferably circulates along the electronic modules E1, E2, E3, E4 to be cooled. The effectiveness of the aeraulic cooling is increased.

Moreover, it may be noted that the bottom plate P, serving as a bottom cover for the computer C, can have a large number of holes H, with relatively large diameters, typically greater than 5 millimetres, in order to favour natural convection within the computer C. This makes it possible to provide a minimal aeraulic cooling, even in the event of failure of a fan V1 or V2, or even in the event of simultaneous failure of both fans V1 and V2.

FIG. 3 provides a better view of the routing of the stream of cool air FA, which becomes a stream of hotter air HA on leaving the computer C. The stream of cool air FA therefore rises along the electronic modules E1, E2, E3, E4 until it reaches the top face 4. There, a part called vent S directs the air stream that has become hotter HA to the rear face 2 where it is discharged.

It should also be noted that it is preferable to know the locations of the hot spots of the electronic modules E1, E2, E3, E4; that is, the areas identified as those most subject to heating because of a power density dissipated by the electronic components present on the electronic modules that is particularly high at these points. These hot spots can be linked to heat sinks mounted on said electronic modules E1, E2, E3, E4. The routing of the air towards these hot spots is handled by a system of piccolo tubes, in accordance with the method described in the French patent application number 0607628000. A complementary network of ducts N3 can thus route the stream of cool air FA to these piccolo tubes.

Thus, the main benefit of the invention is that it makes the aeraulic cooling of onboard computers more effective. It even makes it simply possible in the current and future cases for which the dissipated power within the computers is high. Entirely stand-alone, a computer equipped with an aeraulic cooling device according to the invention further makes it possible to totally dispense with the constraints of the ARINC standard.

The invention claimed is:

1. Onboard computer comprising electronic modules (E1, E2, E3, E4) and an aeraulic cooling module (V), and having a front face (1), a rear face (2), a bottom face (3) and a top face (4), wherein said aeraulic cooling module (V) comprises:
at least one fan (V1, V2) situated on the front face (1), and used to inject a stream of cool air (FA) into said computer (C),
a network of ducts comprising first ducts (N1) for routing the stream of cool air to the level of the bottom face, and second ducts (N2) for distributing said stream of cool air (FA) to the level of said bottom face (3), approximately vertical to said electronic modules (E1, E2, E3, E4), said stream of cool air rising along said electronic modules in order to cool them, and becoming, at the level of the top face, a stream of hotter air.

2. Computer according to claim 1, comprising two fans (V1, V2) on the front face (1).

3. Computer according to claim 1, wherein the at least one fan (V1, V2) is positioned inside the aeraulic cooling module (V), allowing for a strong attenuation, through the walls of said aeraulic cooling module (V), of the noise generated by said at least one fan (V1, V2).

4. Computer according to claim 1, with hot spots, corresponding to areas having a particularly high dissipated power density, being identified on the electronic modules (E1, E2, E3, E4), wherein a complementary network of ducts (N3) routes the stream of cool air (FA) along the electronic modules (E1, E2, E3, E4), passing as a priority through said hot spots.

5. Computer according to claim 4, wherein said hot spots are linked to heat sinks mounted on the electronic modules (E1, E2, E3, E4) via a network of piccolo tubes.

6. Computer according to claim 1, comprising, at the level of the bottom face (3), a largely open bottom plate (P), comprising holes (H) that can be of a diameter greater than approximately 5 millimeters, so as to favour natural convection within said computer (C).

7. Computer according to claim 1, also comprising a vent (S) at the level of the top face (4), routing the stream of hotter air (HA) to the rear face (2) of the computer (C), where said stream of hotter air (HA) is discharged.

* * * * *